United States Patent [19]

Lee

[11] Patent Number: 5,524,097
[45] Date of Patent: Jun. 4, 1996

[54] POWER SAVING SENSE AMPLIFIER THAT MIMICS NON-TOGGLING BITLINE STATES

[75] Inventor: Napoleon W. Lee, Milpitas, Calif.

[73] Assignee: Xilinx, Inc., San Jose, Calif.

[21] Appl. No.: 398,019

[22] Filed: Mar. 3, 1995

[51] Int. Cl.$^6$ ................................. G11C 7/06
[52] U.S. Cl. ............... 365/205; 365/189.11; 365/207; 365/208; 365/227; 327/51
[58] Field of Search .................... 365/205, 207, 365/208, 189.08, 189.11, 227, 189.01; 327/51

[56] References Cited

U.S. PATENT DOCUMENTS

| | | | |
|---|---|---|---|
| 5,017,815 | 5/1991 | Shah et al. | 365/205 |
| 5,030,859 | 7/1991 | Ihara | 365/206 |
| 5,189,322 | 2/1993 | Chan et al. | 365/189.01 |

*Primary Examiner*—David C. Nelms
*Assistant Examiner*—Tan T. Nguyen
*Attorney, Agent, or Firm*—Jeanette S. Harms; Edel M. Young

[57] ABSTRACT

A sense amplifier of the present invention provides power savings of between 30% to 70% for typical usage of a programmable logic device. In one embodiment, this sense amplifier includes circuitry for detecting and propagating the logic state on a bit line, an amplifier for amplifying the propagated logic state, and configuration logic for receiving a first configuration bit and a second configuration bit. If the first configuration bit and the second configuration bit have different logic states (indicating a non-toggling state), then the sense amplifier mimics the bit line at either a first logic state or a second logic state. Specifically, if the first configuration bit has the first logic state and the second configuration bit has the second logic state, then the sense amplifier mimics the bit line at the first logic state. However, if the first configuration bit has the second logic state and the second configuration bit has the first logic state, then the sense amplifier mimics the bit line at the second logic state. The sense amplifier of the present invention in its non-toggling states prevents the formation of a current branch, thereby eliminating undesirable power consumption. In contrast, if the first and second configuration bits have the same logic state (indicating a toggling state), then the sense amplifier toggles based on the change in voltage on the bit line.

16 Claims, 3 Drawing Sheets

| CB1 | CB0 | SENSE AMP STATE | ENA | ABL | NBL | PT | A |
|---|---|---|---|---|---|---|---|
| 0 | 0 | ON for toggling | 1 | - | - | - | 1 |
| 0 | 1 | OFF; mimic BL always at 0 | 0 | 1 | 1 | 0 | 0 |
| 1 | 0 | OFF; mimic BL always at 1 | 0 | 1 | 0 | 1 | 1 |
| 1 | 1 | ON for toggling | 1 | - | - | - | 1 |

POWER SAVING SENSE AMPLIFIER THAT MIMICS NON-TOGGLING BITLINE STATES

BACKGROUND OF THE INVENTION

1. Field of the Invention

The present invention relates to a sense amplifier, and in particular to a power saving sense amplifier which significantly reduces power consumption in a programmable logic device.

2. Description of the Related Art

Programmable logic devices (PLDs) are well known in the art. A typical PLD architecture includes an array of function blocks interconnected via an interconnect matrix. Each function block includes an AND array which provides product terms to one of a series of macrocells in the function block. Each macrocell contains an OR gate into which product terms are gated, thereby providing a combinational function. This architecture is described in more detail in the 1994 Xilinx Programmable Logic Data Book on pages 3–5 to 3–8 which is incorporated by reference herein. To provide fast and accurate CMOS level signals to the OR gate, a plurality of sense amplifiers and associated bit lines are used as the AND array which outputs the product terms.

FIG. 1 shows such a known sense amplifier 100 having two enable lines ENA and ENA. Sense amplifier 100 is turned on or enabled by applying a logic 0 signal to line ENA, thereby turning off N-channel transistor 101, and a logic 1 signal to line ENA. Thus, the voltage level on a feedback line FB is established by a weak pull-up N-channel transistor 103 which is turned on by the logic 1 signal provided on line ENA and a strong pull-down N-channel transistor 104 which is controlled by the signal on bit line BL. The voltage provided to a feedback line FB controls the state of N-channel transistor 102, which operates in its linear range.

A weak P-channel transistor 105 and a strong N-channel transistor 102 provides a low trigger point at a bit line voltage on the order of 0.75 volts. If the voltage on bit line BL is high, transistor 104 turns more on, thereby pulling the voltage on feedback line FB lower. This lower voltage in turn causes transistor 102 to turn more off, thereby pulling up the voltage on bit line BL less and assisting the next movement on bit line BL (i.e. the voltage going low). Conversely, if the voltage on bit line BL is low, the voltage on feedback line FB is higher. This higher voltage in turn causes transistor 102 to turn more on, thereby pulling bit line BL to a higher voltage (via transistor 105 which serves as a current source, and operates in saturation mode).

Thus, the voltage on line ABL is controlled by transistor 102 in conjunction with bit line BL. Transistors 106 and 107 form a ratioed inverter, whereas transistors 108 and 109 form a second ratioed inverter. In response to the signal on bit line BL, the two ratioed inverters ensure that the output voltage provided on output line PT is at CMOS levels. Table 1 shows one example of logic 0 and logic 1 voltage values on the lines BL, FB, ABL, NBL, and PT.

TABLE 1

| Signal | Logic 1 | Logic 0 | Difference |
|---|---|---|---|
| BL | 0.769 v | 0.746 v | 0.023 v |
| FB | 1.77–1.88 v | N/A | N/A |
| ABL | 2.76 v | 2.18 v | 0.58 v |
| NBL | 0.491 v | 3.33 v | 2.84 v |

TABLE 1-continued

| Signal | Logic 1 | Logic 0 | Difference |
|---|---|---|---|
| PT | 4.4 v | 0 v | 4.4 v |

Table 1 shows that a small swing in the voltage on bit line BL can produce a switch in the CMOS signal on output line PT.

Depending upon the states of EPROMs 121-1 through 121-n as controlled by word lines WL1 through WLn, the voltage on bit line BL is pulled lower or higher to indicate a logic 0 or logic 1 signal. If any of word lines WL1 through WLn is a logic 1 and assuming that EPROMS are erased, then the voltage on bit line BL is pulled lower to indicate a logic 0 signal. When biased on, EPROMs 121-1 through 121-n pull the voltage on bit line BL toward virtual ground VG. As shown in FIG. 1, virtual ground VG is separated from actual ground by transistor 111, which is controlled by a signal on line ABL.

Sense amplifier 100, however, burns power constantly, irrespective of the voltage on bit line BL. Specifically, transistor 102 is always at least minimally on, thereby providing a current branch through conducting transistor 105, transistor 102, and transistor 112 (or additionally transistor 111 if at least one memory cell of EPROMs 121 is on). Note that because of the analog signal levels provided on lines ABL and NBL, transistors 106/107 and 108/109 also form current paths. Frequently, a plurality or all of the bit lines provide a low signal to their respective sense amplifiers. However, even in this state, considerable power is wasted in the PLD because of the current paths. Therefore, a need arises for a sense amplifier which minimizes power consumption.

SUMMARY OF THE INVENTION

According to the invention, a sense amplifier selectively prevents formation of the current branch if a constant signal is desired at the sense amplifier output line, i.e. a non-toggling state wherein the sense amplifier mimics the bit line at a constant logic state. By eliminating the current associated with the prior art sense amplifier in a non-toggling state, the present invention results in power savings of between 30% to 70% for typical usage of a programmable logic device.

In one embodiment, a sense amplifier of the present invention includes circuitry for detecting and propagating the logic state on a bit line, an amplifier for amplifying the propagated logic state, and configuration logic for receiving a first configuration bit and a second configuration bit. If the first configuration bit and the second configuration bit have different logic states (indicating a non-toggling state), then the sense amplifier mimics the bit line at either a first logic state or a second logic state. Specifically, if the first configuration bit has the first logic state and the second configuration bit has the second logic state, then the sense amplifier mimics the bit line at the first logic state. However, if the first configuration bit has the second logic state and the second configuration bit has the first logic state, then the sense amplifier mimics the bit line at the second logic state. The sense amplifier of the present invention in its non-toggling states prevents the formation of a current branch, thereby eliminating undesirable power consumption. In contrast, if the first and second configuration bits have the same logic state (indicating a toggling state), then the sense amplifier toggles in response to the wordline signal provided by the user.

BRIEF DESCRIPTION OF THE DRAWINGS

FIG. 3 illustrates a table of logic values on various lines in the sense amplifier of FIG. 2 determined by the values of two configuration bits.

DETAILED DESCRIPTION OF THE INVENTION

Figure 2:
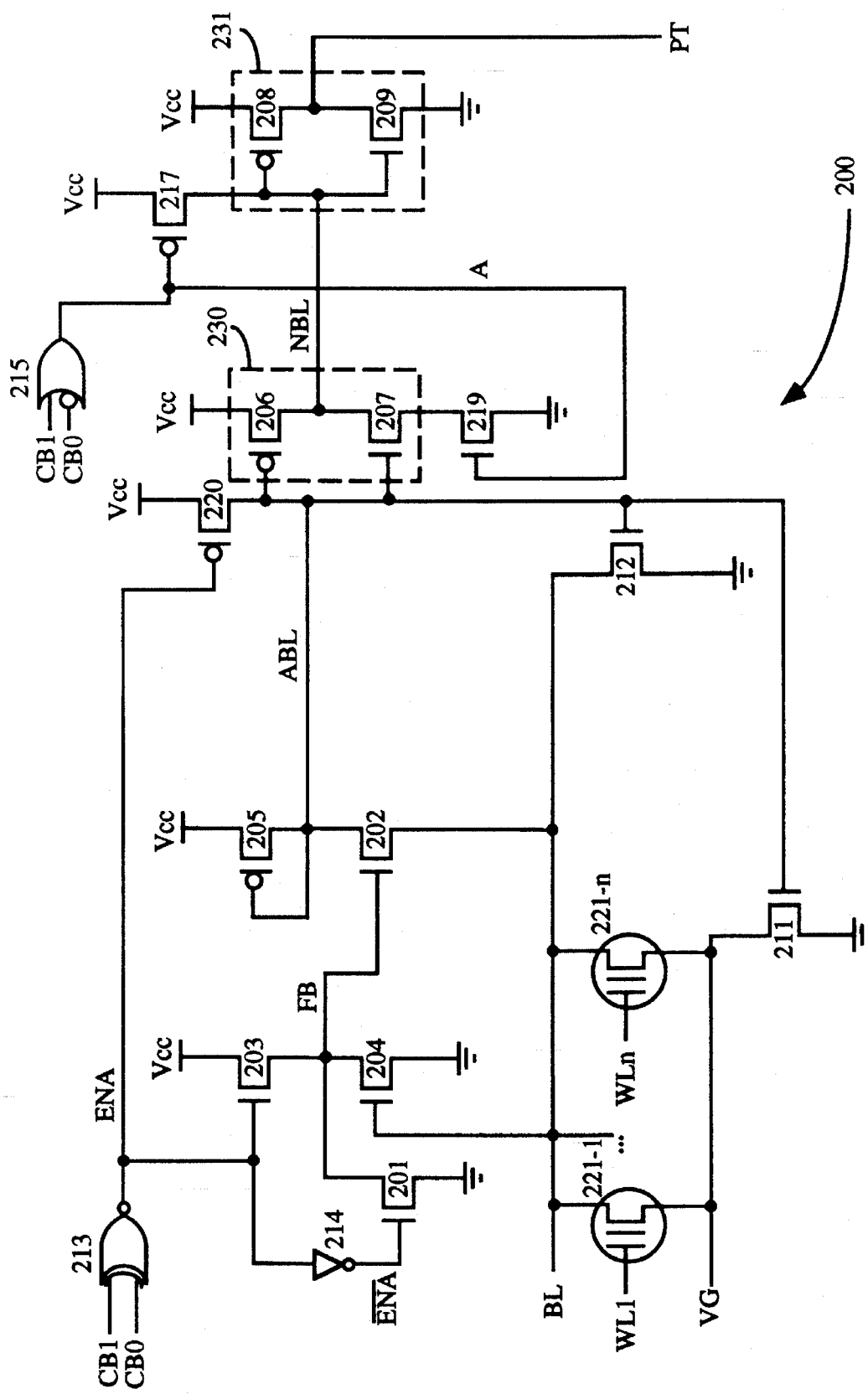
FIG. 2 shows a sense amplifier in accordance with the present invention.

Referring to FIG. 2, two configuration bits, i.e. configuration bits CB0 and CB1, selectively provide a toggling/non-toggling state in sense amplifier 200. A "toggling" state indicates that the bit line BL of sense amplifier 200 is responsive to the input signals provided by the end user on word lines WL, whereas a "non-toggling" state indicates that sense amplifier 200 outputs a constant logic signal irrespective of input signals.

Specifically, if both configuration bits are a logic zero (indicating a toggle state), then exclusive NOR gate 213 provides a logic one enable signal ENA (and in turn a logic zero enable bar signal $\overline{ENA}$ via inverter 214). The high ENA signal turns on pull-up transistor 203 (width to length ratio about 0.5) and turns off transistor 220, whereas the low ENA signal turns off pull-down transistor 201. In this manner, the voltage on line FB is pulled high, thereby turning on transistor 202. The signal on line ABL is thus determined by the voltage on bit line BL. Note that the voltage on line ABL is high (via weak pull-up transistor 205 (width to length ratio about 3.5)) unless the voltage on bit line BL is low.

Note that configuration bits CB0 and CB1, wherein configuration bit CB0 is inverted, are also provided to OR gate 215. Assuming the above configuration, i.e. both bits being logic zero signals, OR gate 215 provides a logic one signal on line A, thereby turning on transistor 219. In this manner, transistors 206 and 207 form a first inverter 230, whereas transistors 208 and 209 form a second inverter 231. Therefore, the signal on line ABL is amplified by inverters 230 and 231, and then provided on output line PT.

FIG. 3 illustrates a table of voltages on lines ENA, ABL, NBL, PT, and A in sense amplifier 200 determined by the values of configuration bits CB0 and CB1. As indicated in FIG. 3, if both configuration bits CB0 and CB1 are logic zero signals, then the state of sense amp 200 is "on" for toggling, i.e. the voltage on output line PT is "toggled" by the change in voltage on bit line BL.

Referring to FIGS. 2 and 3, if configuration bit CB1 is a logic zero signal and configuration bit CB0 is a logic one signal (i.e. indicating a non-toggling state), then exclusive NOR gate 213 provides a logic zero enable signal ENA which turns off transistor 203 and turns on pull-up transistor 220. The high signal transferred by conducting transistor 220 turns off transistor 206, but turns on transistors 207, 211, and 212 (note that in one embodiment, transistor 211 has a width to length ratio about 20).

Figure 1:
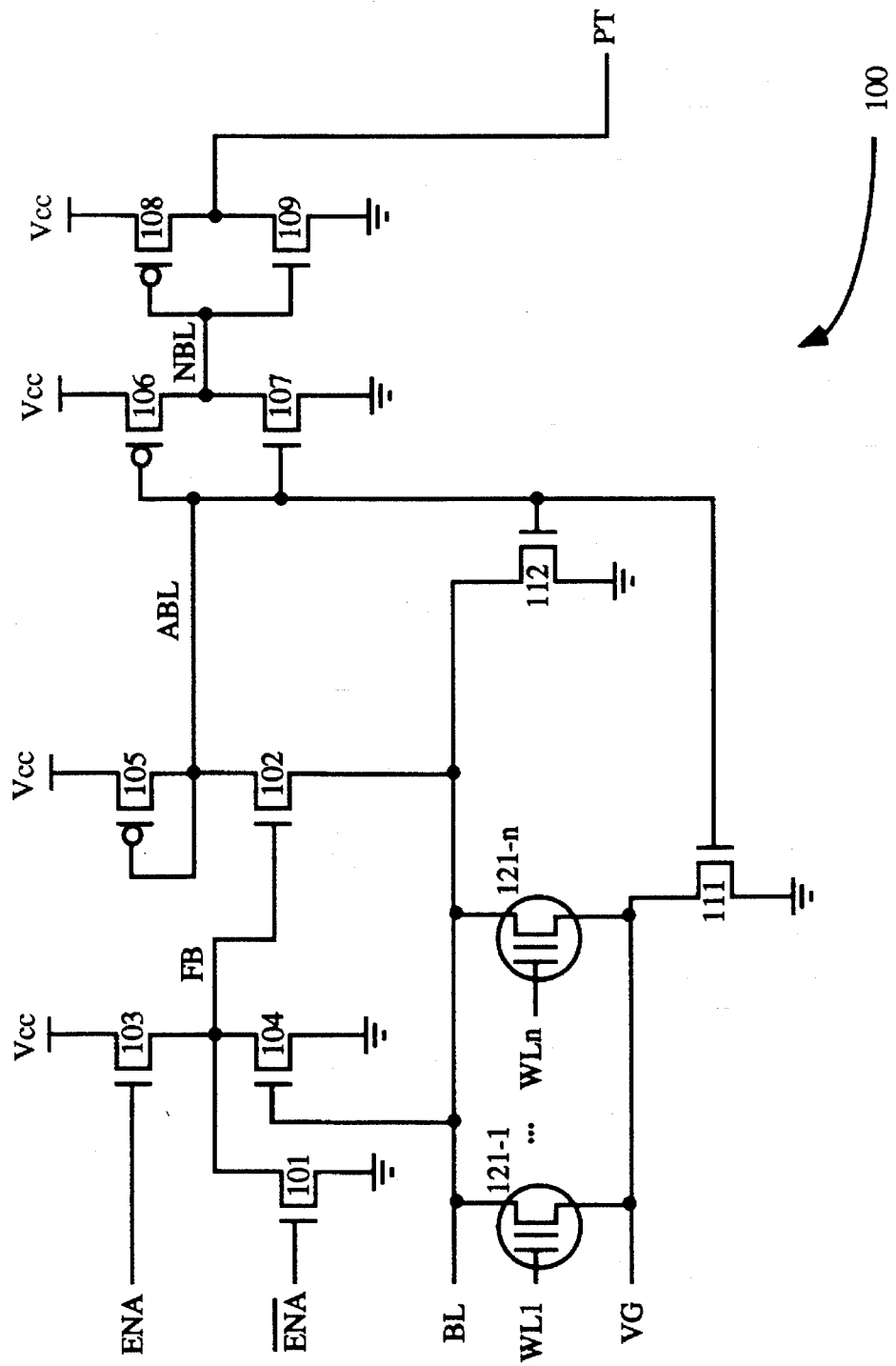
FIG. 1 shows a known sense amplifier.

The low enable signal ENA is further inverted by inverter 214, thereby providing a high enable bar signal $\overline{ENA}$ to the gate of pull-down transistor 201. This high $\overline{ENA}$ signal turns on transistor 201 which in turn grounds the voltage on feedback line FB. Because the voltage on line FB is pulled down to ground, transistor 202 (width to length ratio about 20) is turned completely off, thereby preventing formation of a current branch (i.e. conducting transistors 211 and 212 are a "don't care"). In this manner, the present invention reduces power consumption (described in detail below) compared to prior art sense amplifier 100 (FIG. 1).

Note that in this state if the contribution of transistor 220 is ignored, the voltage on line ABL would be Vcc minus Vtp (i.e. close to a CMOS signal). However, to provide a complete CMOS signal to inverter 230, thereby ensuring that inverter 230 burns no DC current, this embodiment of the present invention includes transistor 220 (described above).

In this non-toggling configuration, OR gate 215 provides a logic zero signal on line A, thereby turning off transistor 219. Thus, first inverter 230 is effectively disabled. However, the logic zero signal on line A turns on transistor 217 which in turn transfers a logic one signal to second inverter 231. Therefore, a logic zero signal is provided on output line (also commonly referred to as the product term line) PT. Thus, in this configuration, sense amplifier 200 mimics bit line BL at a low voltage.

If configuration bit CB1 is a logic one signal and configuration bit CB0 is a logic zero signal (indicating another non-toggling sense amplifier state), then exclusive NOR gate 213 still provides a logic zero enable signal ENA which turns off transistor 203 and turns on pull-up transistor 220. Thus, transistor 206 is still turned off and transistors 207, 211, and 212 are turned on (wherein in one embodiment, transistor 212 has a width to length ratio of approximately 0.5). Therefore, the voltage on bit line BL is pulled low and transistor 202 is completely turned off as described in detail above, thereby providing the same power savings.

However, in this non-toggling configuration, OR gate 215 provides a logic one signal on line A, thereby turning on transistor 219 (width to length ratio about 20). Thus, first inverter 230 provides a logic zero signal on line NBL. The logic one signal on line A turns off transistor 217, thereby ensuring that only the logic zero signal provided on line NBL effects inverter 231. Therefore, a logic one signal is provided on output line PT. As indicated in FIG. 3, in this configuration, sense amplifier 200 mimics bit line BL at a high voltage. Thus, in accordance with the present invention, OR gate 215 in conjunction with transistors 217 and 219 effectively determine the output signal of sense amplifier 200 in its non-toggling state.

If both configuration bits are a logic one (indicating a toggling state), sense amplifier 200 operates in a manner similar to that described above if both configuration bits are a logic zero. Specifically, exclusive NOR gate 213 provides a logic one signal on enable line ENA (and in turn a logic zero signal on enable bar line $\overline{ENA}$ via inverter 214). The high ENA signal turns on pull-up transistor 203 and turns off transistor 220, whereas the low $\overline{ENA}$ signal turns off pull-down transistor 201. In this manner, the voltage on line FB is pulled high, thereby turning on transistor 202. The signal on line ABL is thus determined by the signal level on bit line BL. AS noted previously, the signal on line ABL is a logic high (via weak pull-up transistor 205) unless the signal on bit line BL is a logic low.

Because configuration bits CB0 and CB1 are also provided to OR gate 215, this gate provides a logic one signal on line A, thereby turning on transistor 219. In this manner, transistors 206 and 207 form a first inverter 230, whereas transistors 208 and 209 form a second inverter 231. Therefore, the signal on line ABL is amplified by inverters 230 and 231, and then provided on output line PT.

FIG. 3 illustrates a table of logic levels on lines ENA, ABL, NBL, PT, and A in sense amplifier 200 determined by the values of configuration bits CB0 and CB1. As indicated in FIG. 3, if both configuration bits CB0 and CB1 are logic zero signals, then the state of sense amp 200 is "on" for toggling, i.e. the voltage on output line PT is "toggled" by the change in voltage on bit line BL.

By eliminating the current branch associated with the prior art sense amplifier in a non-toggling state, the present invention results in power savings of between approximately 30% to 70% for typical usage of a programmable logic device. For example, if five bit lines, i.e. product term lines, are provided to a macrocell, i.e. a cell including an OR gate, but only two bit lines are actually actively used by the user, then the present invention allows three bit lines to provide constant logic zero signals, thereby ensuring a power savings of 66%.

In light of the above description, those skilled in the art will recognize other embodiments to the present invention. Such other embodiments are intended to fall within the scope of the present invention which is set forth in the appended claims.

I claim:

1. A sense amplifier comprising:
   a bit line;
   circuitry for detecting and propagating the logic state on said bit line;
   an amplifier for amplifying said logic state; and
   configuration logic for receiving a first configuration bit and a second configuration bit,
      wherein if said first configuration bit and said second configuration bit have different logic states, then said sense amplifier mimics said bit line at either a first logic state or a second logic state, and
      wherein if said first configuration bit and said second configuration bit have the same logic state, then said sense amplifier toggles based on the voltage on said bit line.

2. The sense amplifier of claim 1 wherein if said first configuration bit has said first logic state and said second configuration bit has said second logic state, then said sense amplifier mimics said bit line at said first logic state, and wherein if said first configuration bit has said second logic state and said second configuration bit has said first logic state, then said sense amplifier mimics said bit line at said second logic state.

3. The sense amplifier of claim 2 wherein said amplifier includes a first inverter for receiving an output signal from said circuitry for detecting and propagating and a second inverter receiving an output signal of said first inverter and providing an output signal of said sense amplifier.

4. The sense amplifier of claim 3 wherein said configuration logic includes a first logic gate for receiving said first and second configuration bits and providing a first signal to said circuitry for detecting and propagating.

5. The sense amplifier of claim 4 wherein said configuration logic further includes a first pass transistor controlled by said first signal and providing a control signal to said first inverter.

6. The sense amplifier of claim 5 wherein said configuration logic includes means for disabling said first inverter if said sense amplifier mimics said bit line at said first logic state.

7. The sense amplifier of claim 6 wherein said configuration logic includes a second logic gate for receiving said first and second configuration bits and providing a second signal to said means for disabling.

8. The sense amplifier of claim 7 wherein said configuration logic further includes means for providing a signal to said second inverter if said sense amplifier mimics said bit line at said first logic state.

9. The sense amplifier of claim 8 wherein said second logic gate also provides said second signal to said means for providing, wherein said signal has the opposite logic state of said bit line.

10. The sense amplifier of claim 4 wherein said first logic gate includes an exclusive NOR gate.

11. The sense amplifier of claim 10 wherein said first pass transistor includes a p-type transistor.

12. The sense amplifier of claim 7 wherein said second logic gate includes a OR gate.

13. The sense amplifier of claim 12 wherein said means for disabling includes an n-type transistor.

14. The sense amplifier of claim 13 wherein said means for providing includes a p-type transistor.

15. A sense amplifier comprising:
   a bit line;
   pull up circuitry for pulling up the logic state on said bit line;
   pull down circuitry for pulling down said logic state on said bit line;
   an amplifier for amplifying said logic state; and
   logic for isolating said pull up circuitry from said pull down circuitry in a non-toggling sense amplifier state.

16. A method of minimizing power consumption in a sense amplifier comprising the steps of:
   detecting a voltage on a bit line of said sense amplifier; and
   providing a first configuration bit and a second configuration bit,
      wherein if said first configuration bit and said second configuration bit have different logic states, then said sense amplifier mimics said bit line at either a first logic state or a second logic state, and
      wherein if said first configuration bit and said second configuration bit have the same logic state, then said sense amplifier amplifies said voltage on said bit line.

* * * * *